(12) United States Patent
Jung et al.

(10) Patent No.: US 8,745,309 B2
(45) Date of Patent: Jun. 3, 2014

(54) COOPERATIVE MEMORY MANAGEMENT

(75) Inventors: Myoung-Soo Jung, Suwon (KR); Chan-Ik Park, Seoul (KR); Sang-Jin Oh, Suwon (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 686 days.

(21) Appl. No.: 11/833,731

(22) Filed: Aug. 3, 2007

(65) Prior Publication Data

US 2008/0189485 A1 Aug. 7, 2008

(30) Foreign Application Priority Data

Feb. 1, 2007 (KR) .................. 10-2007-0010573

(51) Int. Cl.
*G06F 12/00* (2006.01)
*G06F 12/02* (2006.01)

(52) U.S. Cl.
CPC .... *G06F 12/0246* (2013.01); *G06F 2212/7206* (2013.01)
USPC ............................ 711/103; 711/154; 713/100

(58) Field of Classification Search
CPC ................ G06F 3/06–3/0689; G06F 12/0246; G06F 13/00; G06F 13/1668; G06F 2212/72–2212/7211
USPC .............. 711/103, 115, 154, 170; 712/28, 30; 718/8–19, 105; 713/1–2, 100; 719/321–327
See application file for complete search history.

(56) References Cited

U.S. PATENT DOCUMENTS

| | | | | |
|---|---|---|---|---|
| 4,984,190 A * | 1/1991 | Katori et al. | ............... | 709/237 |
| 5,319,751 A * | 6/1994 | Garney | ............... | 711/115 |
| 5,687,346 A * | 11/1997 | Shinohara | ............... | 711/130 |
| 6,081,447 A | 6/2000 | Lofgren et al. | | |
| 6,151,709 A * | 11/2000 | Winkel | ............... | 717/173 |
| 6,260,102 B1 * | 7/2001 | Robinson | ............... | 711/103 |
| 6,701,402 B1 * | 3/2004 | Alexander et al. | ........... | 710/305 |
| 6,938,116 B2 | 8/2005 | Kim et al. | | |
| 6,990,662 B2 * | 1/2006 | Messer et al. | ............... | 717/174 |
| 7,039,754 B2 * | 5/2006 | Sasaki | ............... | 711/103 |
| 7,966,039 B2 * | 6/2011 | Sadovsky et al. | ............ | 455/557 |
| 2003/0221092 A1 * | 11/2003 | Ballard et al. | ............... | 713/1 |

(Continued)

FOREIGN PATENT DOCUMENTS

| | | |
|---|---|---|
| JP | 05-173989 | 7/1993 |
| JP | 08-087441 | 4/1996 |

(Continued)

OTHER PUBLICATIONS

English Abstract U.S. Patent No. 5,778,197 for Publication No. 97-71280.

(Continued)

*Primary Examiner* — April Y Blair
*Assistant Examiner* — Nicholas Simonetti
(74) *Attorney, Agent, or Firm* — F. Chau & Associates, LLC

(57) ABSTRACT

A cooperative memory card system includes a memory card device, and a host in signal communication with the memory card device, where the host assumes at least one memory management function for the memory card device; and a corresponding method of cooperative memory management between a host and a memory card device includes selecting at least one of several memory management functions to be performed by the host for the device.

51 Claims, 9 Drawing Sheets

(56) References Cited

U.S. PATENT DOCUMENTS

| | | |
|---|---|---|
| 2005/0057973 A1* | 3/2005 | Khatami et al. ......... 365/185.33 |
| 2005/0073884 A1 | 4/2005 | Gonzalez et al. |
| 2005/0080986 A1* | 4/2005 | Park .............................. 711/103 |
| 2005/0144360 A1 | 6/2005 | Bennett et al. |
| 2005/0270993 A1* | 12/2005 | Rajamani et al. ............. 370/311 |
| 2006/0026334 A1* | 2/2006 | Adluri ........................... 710/317 |
| 2006/0064538 A1 | 3/2006 | Aizawa |
| 2006/0094477 A1* | 5/2006 | Rivera-Cintron et al. .... 455/574 |
| 2006/0130004 A1 | 6/2006 | Hughes et al. |
| 2006/0157549 A1* | 7/2006 | Stein .............................. 235/375 |
| 2006/0184723 A1* | 8/2006 | Sinclair et al. ................ 711/103 |
| 2006/0184724 A1* | 8/2006 | Meir et al. .................... 711/103 |
| 2006/0209444 A1* | 9/2006 | Song et al. ........................ 360/31 |
| 2007/0180186 A1* | 8/2007 | Cornwell et al. ............. 711/103 |
| 2008/0235410 A1 | 9/2008 | Koh |
| 2010/0023781 A1 | 1/2010 | Nakamoto |

FOREIGN PATENT DOCUMENTS

| | | |
|---|---|---|
| JP | 10-063519 | 3/1998 |
| JP | 2003-022427 | 1/2003 |
| JP | 2006-092169 | 4/2006 |
| JP | 2006-172449 | 6/2006 |
| JP | 2006-338481 | 12/2006 |
| JP | 2008-11512 | 1/2008 |
| KR | 97-71280 | 11/1997 |
| KR | 1020040082921 | 9/2004 |
| KR | 1020050027233 | 3/2005 |
| KR | 1020050078916 | 8/2005 |
| KR | 1020060080972 | 7/2006 |
| KR | 1020060090080 | 8/2006 |
| KR | 1020060090087 | 8/2006 |
| KR | 1020070008403 | 1/2007 |
| WO | WO 2005-036401 | 4/2005 |
| WO | WO 2005-066970 | 7/2005 |
| WO | WO 2006-123919 | 11/2006 |

OTHER PUBLICATIONS

English Abstract for Publication No. JP2003-022427.
English Abstract for Publication No. JP2006172449.
English Abstract for Publication No. JP2006-338481.
English Abstract for Publication No. JP2006-092169.
English Abstract for Publication No. 2008-11512.

* cited by examiner

COOPERATIVE MEMORY MANAGEMENT

CROSS-REFERENCE TO RELATED APPLICATION

This application claims foreign priority under 35 U.S.C. §119 to Korean Patent Application No. P2007-0010573, filed on Feb. 1, 2007, in the Korean Intellectual Property Office, the disclosure of which is incorporated by reference herein in its entirety.

BACKGROUND OF THE INVENTION

The present disclosure generally relates to mass digital data storage systems using flash memory technologies, and more specifically relates to techniques for efficiently distributing the resources of such systems.

Emerging portable electronic devices, such as computers, digital cameras, digital music players, cellular telephones, personal data assistants, and the like, are making increasing use of flash memories and/or flash cards. A flash card may include SSDs, SD cards, MMCs, Memory Sticks, embedded cards such as moviNAND, GBNAND, iNAND, and the like. Hosts communicate with flash memories using a flash translation layer ("FTL"). The FTL is typically stored on the flash card either in a controller or in a flash memory, and a form of firmware is used to effectively manage the card.

The FTL performs several functions such as address mapping, wear-leveling, garbage collection, and the like. An address mapping operation translates a logical address received from a host into a physical address, which will actually be used to store data within the flash memory. Wear-leveling may be implemented as a firmware technique for balancing the erase counts of physical blocks to fully utilize the lifetime of NAND flash, for example. A garbage collection operation may collect valid data of several blocks and fill in one block, freeing the originals.

A conventional flash card may perform all FTL functions in the flash controller. Unfortunately, the resources of flash controllers are generally smaller than those of hosts. Thus, a resulting execution speed of such FTL functions performed in the controller is typically slow. In some cases, the FTL functions cannot be performed at all, such as where the controller becomes overloaded.

SUMMARY OF THE INVENTION

These and other issues are addressed by a cooperative memory management system. Exemplary embodiments are provided.

An exemplary cooperative memory card system is provided, comprising a memory card device, and a host in signal communication with the memory card device, wherein the host assumes at least one memory management function for the memory card device.

In addition, similar exemplary memory card systems are provided. Another such system is provided wherein the host issues at least one command to the memory card device. A similar system is provided wherein the at least one command comprises a command for at least one of a read, a write, a copy or an erase. Another similar system is provided wherein the at least one command comprises a command for at least one of a write to a single-level cell region or a write to a multi-level cell region. Yet another similar system is provided wherein the at least one command comprises a command for at least one of enabling or disabling at least one of encryption or decryption.

Another system is provided comprising at least one of flash memory, FRAM, PRAM, MRAM, DRAM or EEPROM. Another system is provided wherein the at least one memory management function is a flash translation layer task. Another system is provided wherein the at least one memory management function is an operating system task. Another system is provided wherein the at least one memory management function is a device driver task.

Yet another system is provided wherein the host comprises a host processor and a working memory in signal communication with the host processor. Another system is provided wherein the host performs resource checking of the memory card device and assumes the at least one task of the memory card device in response thereto. Another system is provided wherein the host checks its own available resources and assumes the at least one task of the memory card device in response thereto. Another system is provided wherein the host performs resource checking of the memory card device, compares the resources of the memory card device with available resources of the host, and assumes the at least one task of the memory card device in response to the comparison.

A further system is provided wherein the at least one task of the memory card device assumed by the host is at least one of a function for address mapping, wear leveling, garbage collection, power-off recovery, bad block management, error correction coding, write buffering for real-time management, hot versus cold data management, encryption, decryption, compression or decompression. Another system is provided wherein vendor specific memory card device drivers include software modules for performing memory management functions. A similar system is provided wherein the host determines which of the software modules for performing memory management functions will be loaded to the host.

Another system is provided wherein the memory card device comprises at least one of a solid-state disk, USB card, SD card, MMC, Memory Stick or embedded device. A similar system is provided wherein the embedded device comprises at least one of a moviNAND, GBNAND or iNAND.

Another system is provided wherein the memory card device comprises a controller and a memory in signal communication with the controller. A similar system is provided with the controller comprising a controller processor, a read-only memory in signal communication with the controller processor, and a buffer memory in signal communication with the controller processor. Another similar system is provided with the memory comprising a region having memory management function code, and a region having user data. Yet another similar system is provided wherein the region having memory management function code is a flash translation layer. Still another similar system is provided wherein the at least one task of the memory card device assumed by the host is a function of the memory management function code. A further similar system is provided wherein the memory management function code comprises at least one of program instructions or data. An additional similar system is provided with the memory comprising a region having an operating system image, and a region having user data. Yet another similar system is provided wherein memory management functions are embedded in a file system of the operating system image. Still another similar system is provided wherein memory management functions are embedded in at least one device driver of the host. Another similar system is provided wherein memory management functions are embedded in a flash translation layer of the device. Still another similar system is provided wherein the at least one task of the memory card device assumed by the host is a function of the operating system image. Another similar system is provided wherein the operating system image includes software modules for executing all memory management functions. Yet one more similar system is provided wherein the operating system image does not include software modules for performing memory management functions.

An exemplary method of cooperative memory management between a host and a memory card device is provided, the method comprising selecting at least one of a plurality of memory management functions to be performed by the host for the device.

In addition, similar exemplary methods of cooperative memory management are provided. Another such method includes checking the available resources of at least one of the host or the device, and selecting the at least one memory management function in response to the checked available resources. Another method is provided wherein the resources checked are those of the host. Another method is provided wherein the resources checked are those of the device. Another method is provided wherein the resources checked are those of the host and those of the device. Another method is provided wherein checking the available resources comprises the device issuing a request to the host for the host to perform the selected at least one memory management function. Another method is provided wherein the host issues at least one command to the memory card device. A similar method is provided wherein the at least one command comprises a command for at least one of a read, a write, a copy or an erase. Another similar method is provided wherein the at least one command comprises a command for at least one of a write to a single-level cell region or a write to a multi-level cell region. Yet another similar method is provided wherein the at least one command comprises a command for at least one of enabling or disabling at least one of encryption or decryption. Still another similar method is provided wherein the at least one command comprises a command for checking available resources of the device. An additional similar method is provided wherein the at least one command is unconditional.

Another method is provided comprising loading the selected at least one memory management function from the memory card device to a random access memory of the host.

Yet another method is provided wherein the at least one memory management function comprises a function of a flash translation layer. Another method is provided comprising using the host to check the available resources of the memory card device, comparing the available resources of the host with the available resources of the memory card device, and determining which memory management functions will be performed in the host and which in the memory card device in response to the comparison. Another method is provided wherein the available resources of the host comprise at least one of processor type, processor speed, memory size, memory speed, bus type, bus speed, encryption type or encryption speed. Another method is provided wherein the memory management functions comprise at least one of address mapping, wear leveling, garbage collection or erase count accumulation. Another method is provided wherein the selected at least one memory management function for the host has a parameter set for the host but reset for the device. A similar method is provided wherein the remainder of the memory management functions not selected for the host have parameters reset for the host but set for the device.

Another method is provided wherein a communication protocol between the host and the device comprises at least one of a universal serial bus protocol or an advanced technology attachment protocol.

A further method is provided wherein the selected at least one memory management function is comprised by flash translation layer code from the memory card device. Another method is provided wherein the selected at least one memory management function is comprised by a device driver. Another method is provided wherein the selected at least one memory management function is comprised by an operating system from the memory card device. Another method is provided comprising loading memory management function code from a memory of the memory card device into a controller random access memory of the memory card device, and loading an operating system from the memory of the memory card device into the random access memory of the host. A similar method is provided, further comprising initializing the operating system in the host.

Yet another method is provided comprising loading at least one vendor specific memory card device driver into a random access memory of the host. Another method is provided comprising loading meta data from the memory card device to the host. A similar method is provided wherein the meta data comprises at least one of erase count data, garbage collection data or mapping table data loaded to the host random access memory from the memory card device.

Another method is provided comprising initializing the selected memory management functions in the host. Another method is provided comprising activating the selected memory management functions in the host. Another method is provided comprising producing a write request from the host, reading mapping information using host memory management functions, checking for write space available on the memory card device, and sending the write request to the device if there is write space available on the device.

A further method is provided comprising checking for garbage blocks on the memory card device, if there are no garbage blocks on the device, performing garbage collection, designating garbage blocks and updating garbage collection data, and erasing the garbage blocks. Another method is provided comprising checking the need for wear leveling on the memory card device, and if wear leveling is needed, performing wear leveling and updating meta data for wear leveling.

The present disclosure will be further understood from the following description of exemplary embodiments, which is to be read in connection with the accompanying drawings.

BRIEF DESCRIPTION OF THE DRAWINGS

The present disclosure provides cooperative memory management for a partitioned flash translation layer ("FTL") in accordance with the following exemplary figures, in which.

DETAILED DESCRIPTION OF PREFERRED EMBODIMENTS

The present disclosure provides for cooperative memory management between a host and a flash memory device. Exemplary embodiments of the present disclosure include systems having partitioned flash translation layers (FTL), and corresponding methods. An exemplary cooperative memory management approach uses a host to check the resources of a flash card, compare the resources of the flash card with those of the host and determine which FTL functions are to be run by the host and which by the card.

Figure 1:
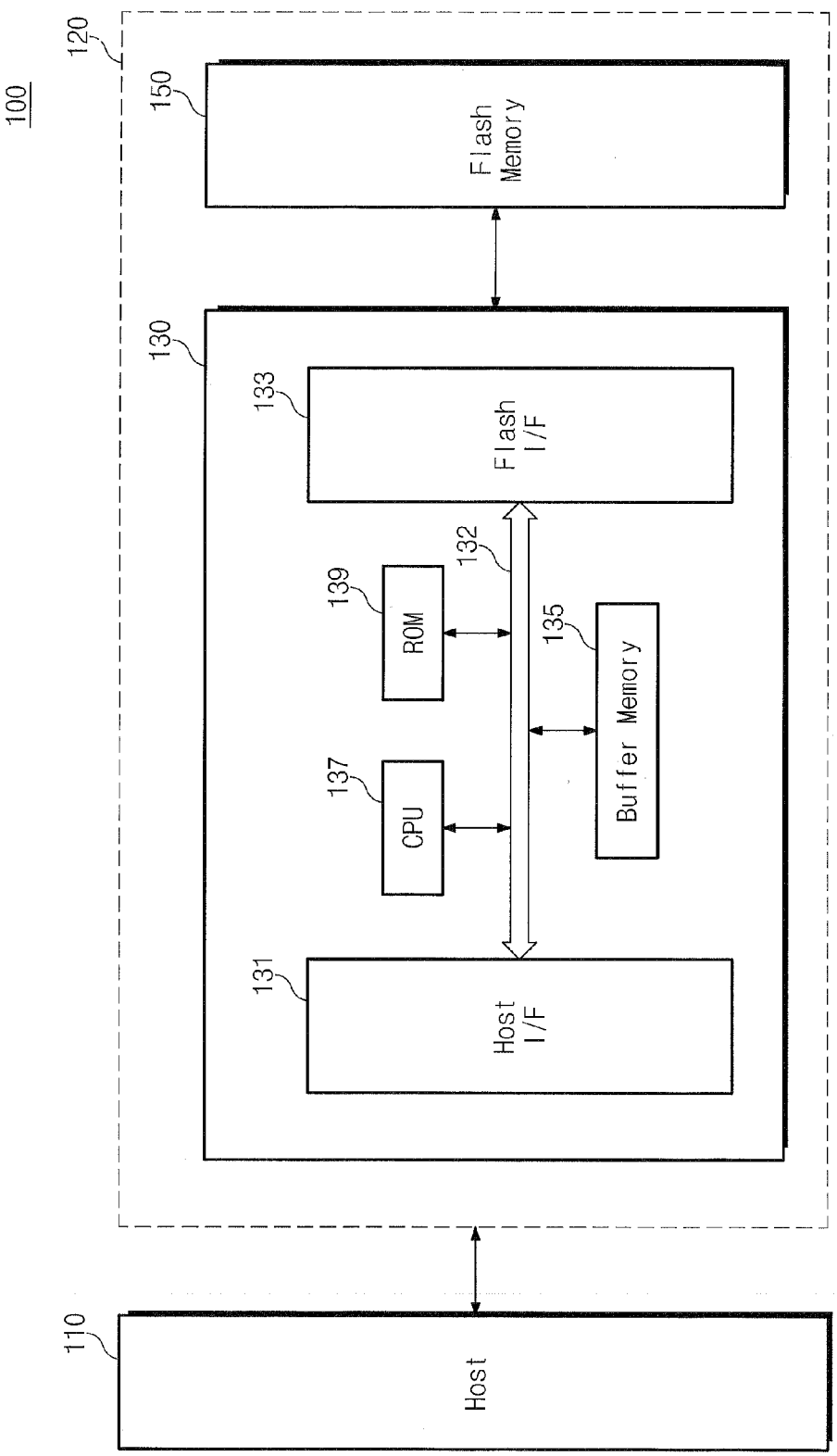
FIG. 1 shows a schematic block diagram for a flash memory card system having a flash translation layer.

As shown in FIG. 1, a flash memory card system is indicated generally by the reference numeral 100. The system 100 may be a portable electronic device, such as a computer, digital camera, digital music player, cellular telephone, personal data assistant (PDA), or the like. The system 100 includes a host 110 in signal communication with a flash card 120. The flash card 120 may be a solid-state disk ("SSD"), SD card, MMC, Memory Stick, an embedded card such as movi-NAND, GBNAND, iNAND, or the like.

The flash card 120 includes a controller 130 in signal communication with a flash memory 150. The host 110 communicates with the flash memory 150 using a flash translation layer ("FTL"), which may include logic and/or firmware used to effectively manage the card 120. The FTL may be stored or implemented in the controller 130 or in the flash memory 150.

Figure 2:
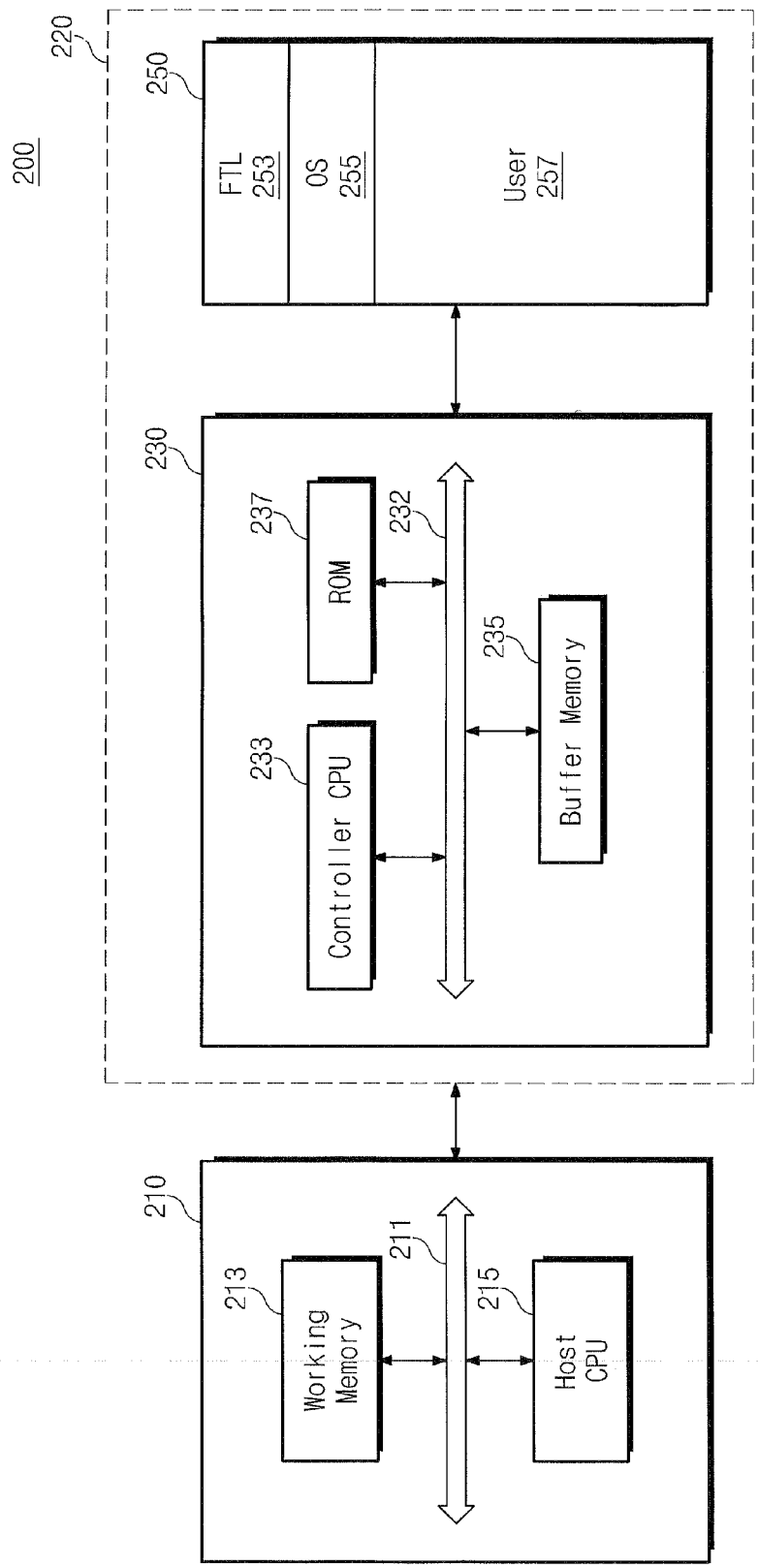
FIG. 2 shows a schematic block diagram for a flash memory card system with cooperative memory management in accordance with an exemplary embodiment of the present disclosure.

The controller 130 includes a host interface 131 in signal communication with a controller bus 132, a flash interface 133 in signal communication with the controller bus 132, a buffer memory 135 in signal communication with the controller bus 132, a CPU 137 in signal communication with the controller bus 132, and a ROM 139 in signal communication with the controller bus 132. Turning to FIG. 2, a flash memory card system with cooperative memory management is indicated generally by the reference numeral 200. The card system 200 includes a host 210 in signal communication with a flash card 220. The host 210 includes a host bus 211, a working memory 213 in signal communication with the host bus 211, and a host CPU 215 in signal communication with the host bus 211.

The flash card 220 includes a controller 230 in signal communication with a flash memory 250. The controller 230 includes a controller bus 232, a controller CPU 233 in signal communication with the controller bus 232, a buffer memory 235 in signal communication with the controller bus 232, and a ROM 237 in signal communication with the controller bus 232. The flash memory 250 includes a flash translation layer ("FTL") code block 253, an operating system ("OS") image block 255 and a user data block 257. In operation, a host CPU 215 and working memory 213 within a host 210 may be relatively faster than a controller CPU 233 and a buffer memory 235 within a controller 230. Thus, the host 210 may be used to perform some functions of the FTL. Initially, the FTL code 253 and OS image 255 are stored in the flash memory 250. The OS image 255 may include a file system and device drivers for executing general functions, for example. The OS image 255 of the present embodiment may further include software modules for executing FTL functions, such as an address mapping function, a wear-leveling function and a garbage collection function.

Figure 3:
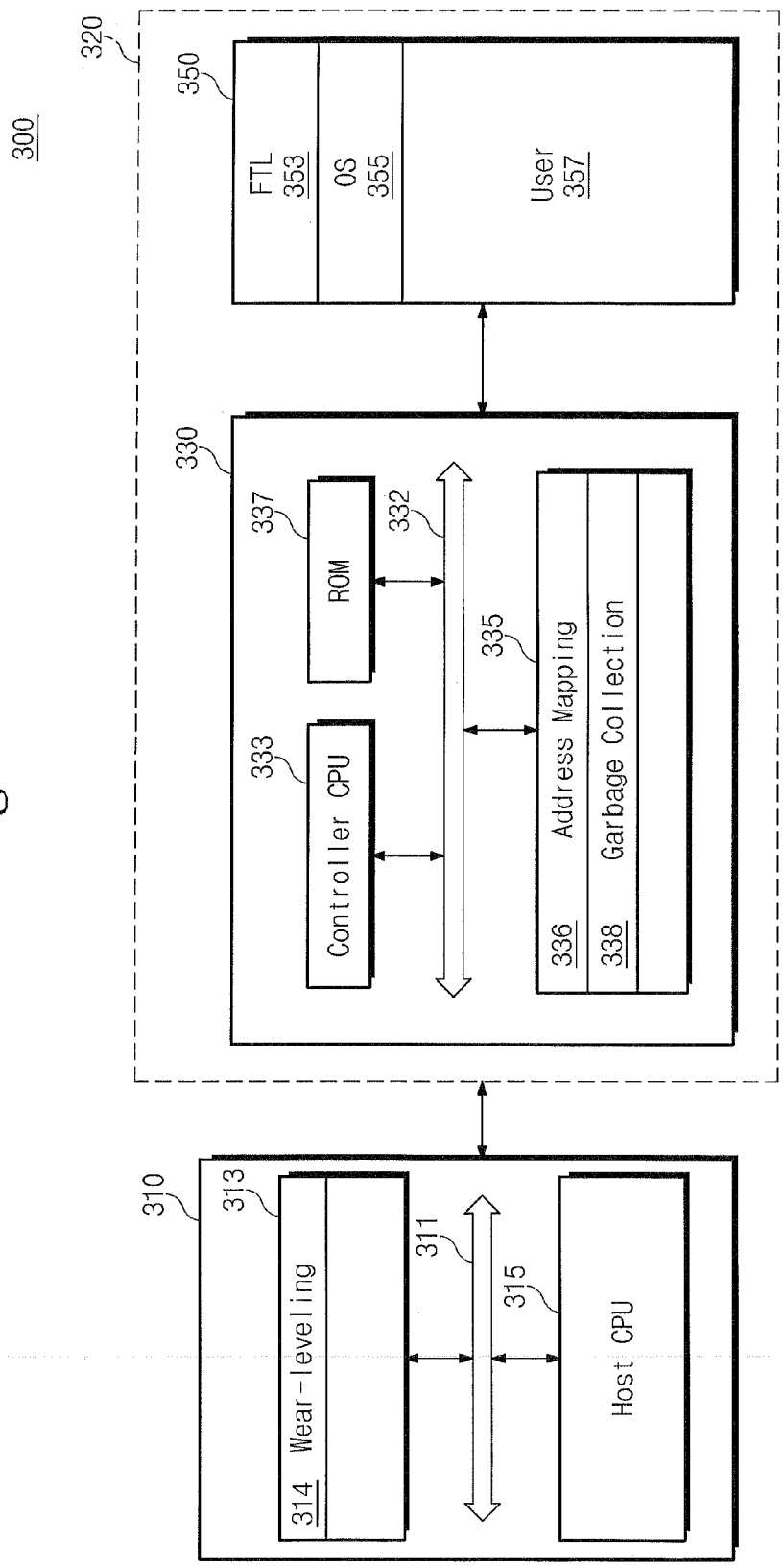
FIG. 3 shows a schematic block diagram for a flash memory card system having a partitioned flash translation layer in accordance with an exemplary embodiment of the present disclosure.

Turning now to FIG. 3, a flash memory card system like the system 200 of FIG. 2 is shown in greater detail with a partitioned FTL, and indicated generally by the reference numeral 300. The card system 300 includes a host 310 in signal communication with a flash card 320. The host 310 includes a host bus 311 a working memory 313 in signal communication with the host bus 311, and a host CPU 315 in signal communication with the host bus 311. The working memory 313 includes a wear-leveling block 314.

The flash card 320 includes a controller 330 in signal communication with a flash memory 350. The controller 330 includes a controller bus 332, a controller CPU 333 in signal communication with the controller bus 332, a buffer memory 335 in signal communication with the controller bus 332, and a ROM 337 in signal communication with the controller bus 332. The buffer memory 335 includes an address mapping block 336 and a garbage collection block 338. The flash memory 350 includes a flash translation layer ("FTL") code block 353, an operating system ("OS") image block 355, and a user data block 357. In operation after power on, the FTL code 353 is loaded to the buffer memory 335, and the OS image 355, which includes some FTL functions, is loaded to the working memory 313 within the host 310. In this manners some FTL functions, such as the address mapping 336 and a garbage collection 338 in this example, operate in the controller, and the other functions, such as the wear-leveling 314 in this example, operate in the host.

Thus, the FTL functions in the host 310 can utilize the resources of the host, which may be relatively larger and/or faster than those in the flash controller 330, to increase performance of the system while efficiently executing all functions of FTL. Here, the OS image may include software modules for executing any or all functions of the FTL in the host. The FTL functions may be embedded in the file system or device drivers within the OS code. Any or all FTL functions included in the OS image, file system or device drivers may be performed by the host instead of by the controller.

In alternate embodiments, the OS image 355 might not include software modules for performing some FTL functions. In such cases, vendor specific device drivers may include the FTL software modules. Generally, the device drivers may be provided by hardware suppliers such as SSD manufacturers. USB/SD/MMC application providers, or the like. Thus, the hosts in these embodiments can determine which FTL functions will be loaded to the host from all of the available embedded FTL functions.

Figure 4:
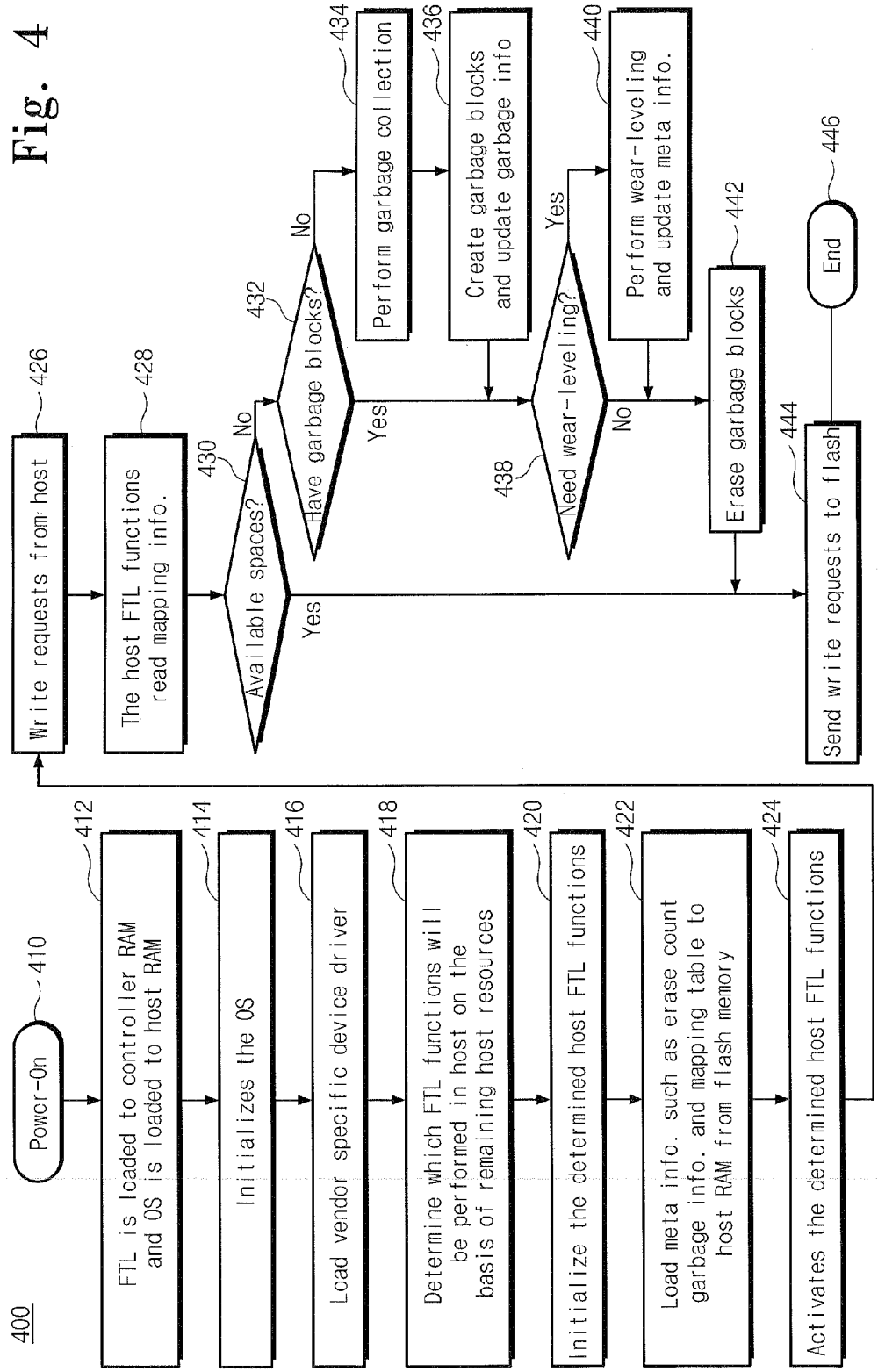
FIG. 4 shows a schematic flowchart for a cooperative memory management method in accordance with an exemplary embodiment of the present disclosure.

As shown in FIG. 4 a method of cooperative memory management is indicated generally by the reference numeral 400. The method 400 includes a start or power-on block 410, which passes control to a function block 412. The function block 412 toads FTL code into the controller RAM, loads OS code into the host RAM, and passes control to a function block 414. The function block 414 initializes the OS in the host, and passes control to a function block 418.

The function block 418, in turn, determines which FTL functions will be performed in the host, on the basis of the host's remaining resources, and passes control to a function block 420. The function block 420 initializes the determined FTL functions on the host, and passes control to a function block 422. The function block 422 loads meta information, such as an erase count, garbage collection data and a mapping table from the flash memory to the host RAM, and passes control to a function block 424. The function block 424 activates the determined host FTL functions, and passes control to a function block 426.

The function block 426, in turn, processes write requests from the host, and passes control to a function block 428. At the function block 428, the host FTL functions read mapping information. Control passes from the function block 428 to a decision block 430. The decision block 430 determines whether there are any available spaces to write into the flash memory, and if so, passes control to a function block 444. If not, the decision block 430 passes control to a decision block 432. The decision block 432 determines whether the flash memory has garbage blocks, and if so, passes control to a decision block 438. If not, the decision block 432 passes control to a function block 434.

The function block 434 performs garbage collection, and passes control to a function block 436. The function block 436 creates garbage blocks, updates the garbage information and passes control to the decision block 438. The decision block 438, in turn, determines whether wear-leveling is needed, and if not, passes control to a function block 442. If so, the decision block 438 passes control to a function block 440. The function block 440 performs wear-leveling, updates meta information, and passes control to the function block 442. The function block 442 erases garbage blocks, and passes control to the function block 444. The function block 444 sends write requests to the flash memory, and passes control to an end block 446.

In operation, a vendor specific device driver may include some or all of the software modules for executing the FTL functions for cooperative memory management of a partitioned FTL. Functionalities of the flash software may include a sector mapping algorithm, garbage collection, power-off recovery, bad block management, wear-leveling, error correction coding ("ECC"), write buffering for real-time management, hot/cold data management, encryption, decryption, compression and decompression.

Figure 5:
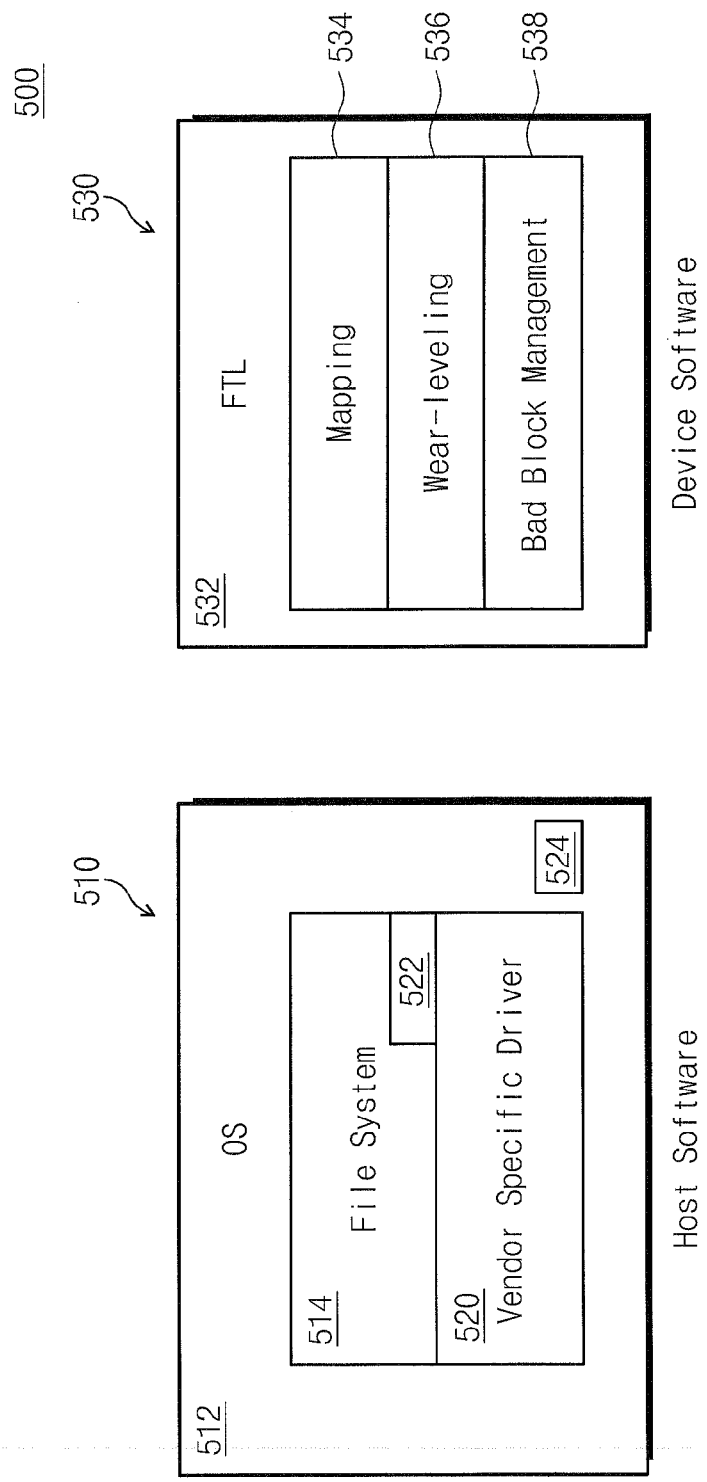
FIG. 5 shows a schematic memory map for a cooperative memory management system in accordance with an exemplary embodiment of the present disclosure.
Figure 6:
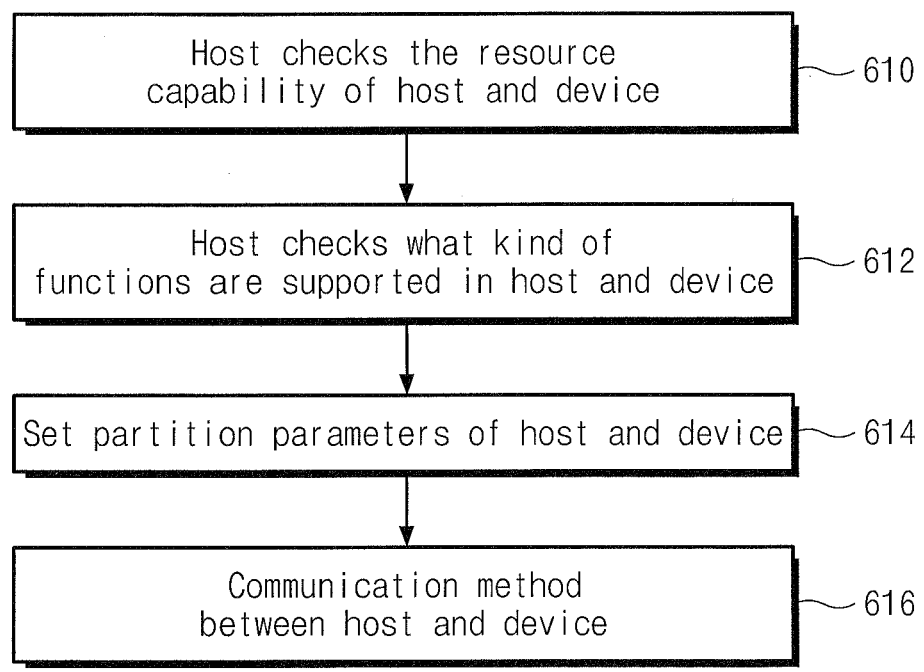
FIG. 6 shows a schematic flowchart for a method of cooperative memory management using a partitioned FTL in accordance with an exemplary embodiment of the present disclosure.

Turning to FIG. 5, a memory map for a cooperative memory management system is indicated generally by the reference numeral 500. The memory map 500 includes host software 510 and device software 530. The host software 510 includes an OS image 512, a file system 514, and a vendor-specific driver 520. The vendor-specific driver 520 may be associated with an additional file system 522 and/or additional OS code 524. The device software 530 includes FTL code 532, which may include a mapping function 534, a wear-leveling function 536 and a bad block management function 538. Turning now to FIG. 6, a method for a cooperative memory management system having a partitioned FTL is indicated generally by the reference numeral 600. The method 600 includes a step 610, at which a host checks the resource capabilities of the host, and checks the resource capabilities of a device. The resource capabilities may include the CPU speed and the memory size for buffering, for example. At a step 612, the host checks to determine what kinds of functions are supported by the host, and checks to determine what kinds of functions are supported by the device. At a step 614, the host and device negotiate and set the partition parameters for the host and for the device. At step 616, the host and device negotiate and set the communication method and parameters between the host and the device.

Figure 7:
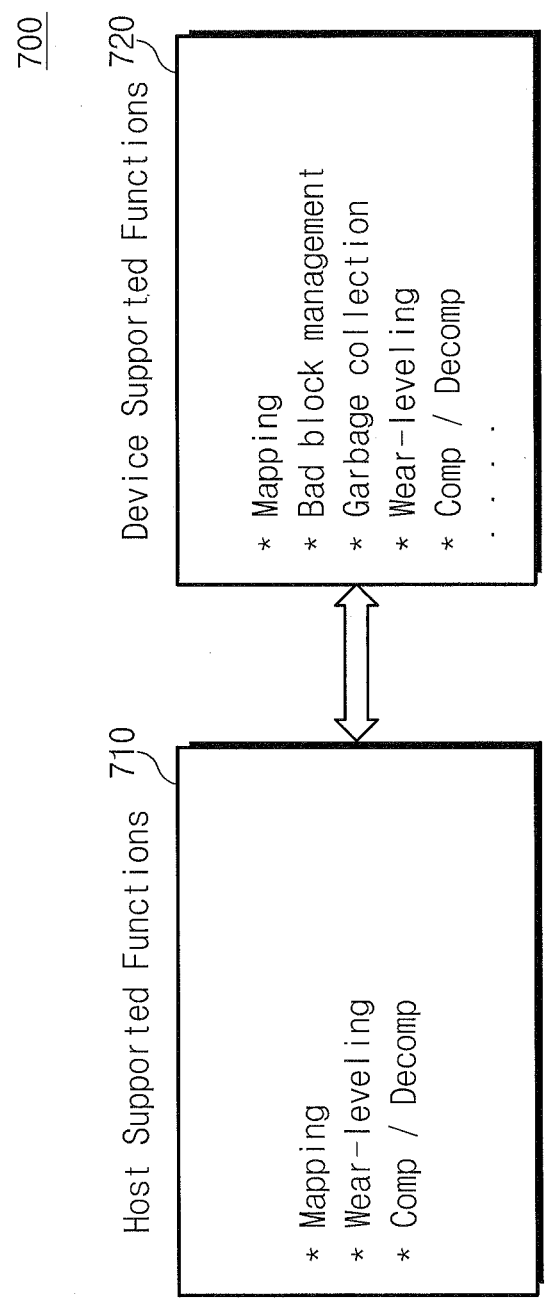
FIG. 7 shows a schematic block diagram for host and device supported functions in accordance with an exemplary embodiment of the present disclosure.

As shown in FIG. 7, an exemplary set of supported functions is indicated generality by the reference numeral 700. The supported functions 700 include host supported functions 710 and device supported functions 720. Here, the host supported functions 710 include a mapping function, a wear-leveling function, and a compression/decompression function.

Figure 8:
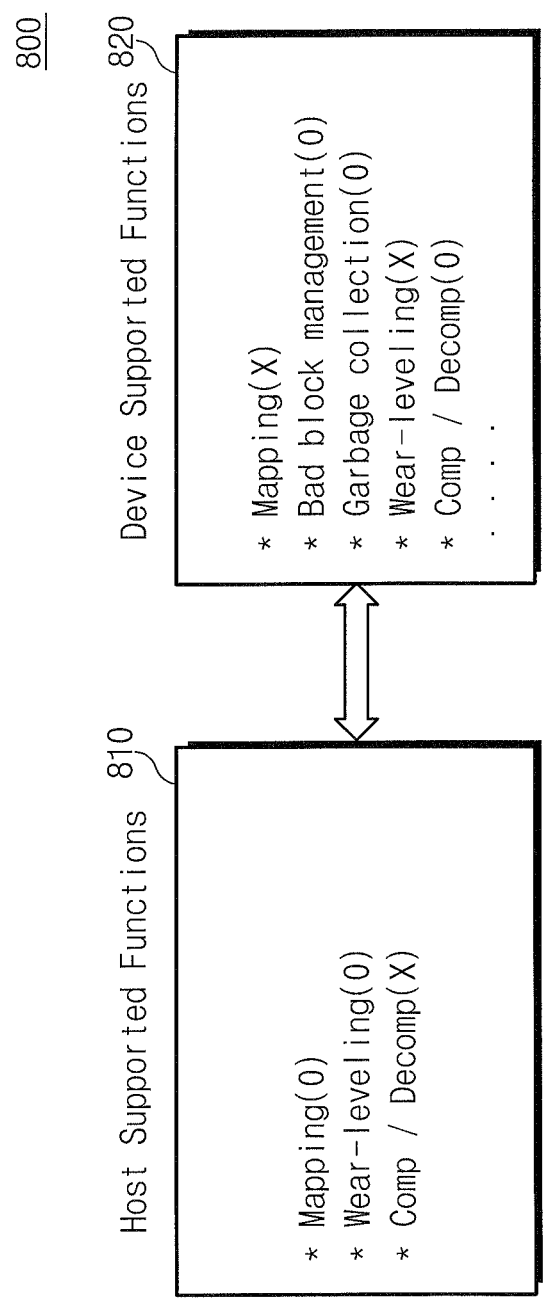
FIG. 8 shows a schematic block diagram for host and device activated functions in accordance with an exemplary embodiment of the present disclosure.

The device supported functions 720 include a mapping function, a bad block management function, a garbage collection function, a wear-leveling function, a compression/decompression function, and possibly other functions. A query about the functionality of the host or the device would return an indication of the above supported functions, respectively. Both the host and the device may have one or more overlapping functions, so it remains to be determined which will actually implement each of the overlapping functions. Turning to FIG. 8, a set of negotiated partitioning parameters is indicated generally by the reference numeral 800. In the figure, "O" indicates that a local function is activated, and "X" indicates that a local function is not activated. The supported functions 800 include host supported functions 810 and device supported functions 820. Here, the host supported functions 810 include a mapping function that is activated on the host, a wear-leveling function that is activated on the host, and a compression/decompression function that is not activated on the host.

The device supported functions 820 include a mapping function that is not activated on the device, a bad block management function that is activated on the device, a garbage collection function that is activated on the device, a wear-leveling function that is not activated on the device, a compression/decompression function that is activated on the device, and possibly other functions that may be activated on the device.

A query about the active functions of the host or the device would return an indication of the above activated functions, respectively. Both the host and the device may have one or more overlapping functions, so a function activated on one of the host or device will generally not be activated on the other of the host or device, respectively.

Figure 9:
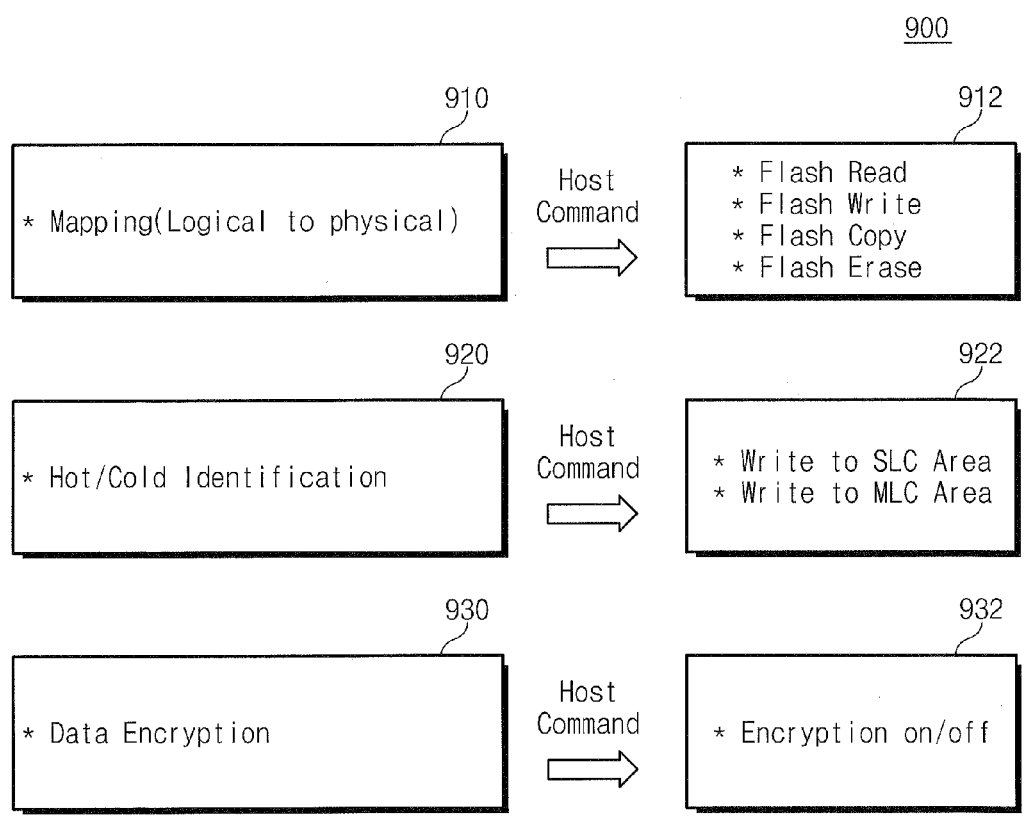
FIG. 9 shows a schematic block diagram for a communication method between a host and a device in a cooperative memory management system in accordance with an exemplary embodiment of the present disclosure.

Turning now to FIG. 9, a communication method at runtime is indicated generally by the reference numeral 900. The communication method 900 includes associated host commands for the FTL functions activated on the host. Here, the FTL functions activated on the host include a logical to physical mapping function 910, a hot/cold data identification function 920, and a data encryption function 930.

Invocation of the mapping function 910 causes the host to issue one of a plurality of mapping commands 912, such as a flash read command, a flash write command, a flash copy command, or a flash erase command. Invocation of the identification function 920 causes the host to issue one of a plurality of identification commands 922, such as a command for writing to an SLC area, or a command for writing to an MLC area. Invocation of the encryption function 930 causes the host to issue one of a plurality of encryption commands 932, such as a command for turning encryption on, or a command for turning encryption off.

Although illustrative embodiments have been described herein with reference to the accompanying drawings, it is to be understood that the present disclosure is not limited to those precise embodiments, and that various other changes and modifications may be effected therein by those of ordinary skill in the pertinent art without departing from the scope or spirit of the present disclosure. All such changes and modifications are intended to be included within the scope of the present disclosure as set forth in the appended claims.

What is claimed is:

1. A cooperative memory card system comprising:
    a memory card device comprising a controller and a flash memory in signal communication with the controller, the flash memory comprising a region having an operating system image and a region having user data; and
    a host in signal communication with the memory card device,
    wherein flash translation layer (FTL) functions executable by both the memory card device and the host are partitioned such that overlapping functions activated on one of the host or the memory card device are not activated on the other of the host or memory card device, respectively,
    wherein those FTL functions to be executed by the host are loaded from the memory card device to a random access memory of the host, and
    wherein the FTL functions for execution by the host are at least one of a function for address mapping, wear leveling and garbage collection.

2. A system as defined in claim 1 wherein the host issues at least one command to the memory card device.

3. A system as defined in claim 2 wherein the at least one command comprises a command for at least one of a read, a write, a copy or an erase.

4. A system as defined in claim 2 wherein the at least one command comprises a command for at least one of a write to a single-level cell region or a write to a multi-level cell region.

5. A system as defined in claim 2 wherein the at least one command comprises a command for at least one of enabling or disabling at least one of encryption or decryption.

6. A system as defined in claim 1, the memory card device comprising at least one of flash memory, FRAM, PRAM, MRAM, DRAM or EEPROM.

7. A system as defined in claim 1, the host comprising:
    a host processor; and
    a working memory in signal communication with the host processor.

8. A system as defined in claim 1 wherein the host performs resource checking of the memory card device and receives the FTL functions for execution by the host in response thereto.

9. A system as defined in claim 1 wherein the host checks its own available resources and receives the FTL functions for execution by the host in response thereto.

10. A system as defined in claim 1 wherein the host performs resource checking of the memory card device, compares the resources of the memory card device with available resources of the host, and receives the FTL functions for execution by the host in response to the comparison.

11. A system as defined in claim 1 wherein the FTL function for execution by the host is at least one of a function for power-off recovery, bad block management, error correction coding, write buffering for real-time management, hot versus cold data management, encryption, decryption, compression or decompression.

12. A system as defined in claim 1 wherein the host determines which software modules for performing FTL functions will be loaded to the host.

13. A system as defined in claim 1 wherein the memory card device comprises at least one of a solid-state disk, USB card, SD card, MMC, Memory Stick or embedded device.

14. A system as defined in claim 13 wherein the embedded device comprises at least one of a moviNAND™, GBNAND™ or iNAND™.

15. A system as defined in claim 1, the controller comprising:
    a controller processor;
    a read-only memory in signal communication with the controller processor; and
    a buffer memory in signal communication with the controller processor.

16. A system as defined in claim 1, the memory comprising:
    a region having memory management function code; and
    a region having user data.

17. A system as defined in claim 16 wherein the region having memory management function code is a FTL.

18. A system as defined in claim 16 wherein the FTL function to be executed by the host is a function of the memory management function code.

19. A system as defined in claim 16 wherein the memory management function code comprises at least one of program instructions or data.

20. A system as defined in claim 1 wherein memory management functions are embedded in a file system of the operating system image.

21. A system as defined in claim 1 wherein memory management functions are embedded in at least one device driver of the host.

22. A system as defined in claim 1 wherein memory management functions are embedded in a FTL of the device.

23. A system as defined in claim 1 wherein the operating system image includes software modules for executing all memory management functions.

24. A system as defined in claim 1 wherein the operating system image does not include software modules for performing memory management functions.

25. A method of cooperative memory management between a host and a memory card device, the method comprising:
    partitioning flash translation layer (FTL) functions executable by both the memory card device and the host such that overlapping functions activated on one of the host or the memory card device are not activated on the other of the host or memory card device, respectively; and
    loading from the memory card device to a random access memory of the host those FTL functions to be executed by the host.

26. A method as defined in claim 25, further comprising:
    checking the available resources of at least one of the host or the device; and
    selecting the FTL functions to be executed by the host in response to the checked available resources.

27. A method as defined in claim 26 wherein the resources checked are those of the host.

28. A method as defined in claim 26 wherein the resources checked are those of the device.

29. A method as defined in claim 26 wherein the resources checked are those of the host and those of the device.

30. A method as defined in claim 26 wherein checking the available resources comprises the device issuing a request to the host for the host to perform the FTL function to be executed by the host.

31. A method as defined in claim 25 wherein the host issues at least one command to the memory card device.

32. A method as defined in claim 31 wherein the at least one command comprises a command for at least one of a read, a write, a copy or an erase.

33. A method as defined in claim 31 wherein the at least one command comprises a command for at least one of a write to a single-level cell region or a write to a multi-level cell region.

34. A method as defined in claim 31 wherein the at least one command comprises a command for at least one of enabling or disabling at least one of encryption or decryption.

35. A method as defined in claim 31 wherein the at least one command comprises a command for checking available resources of the device.

36. A method as defined in claim 31 wherein the at least one command is unconditional.

37. A method as defined in claim 25, further comprising:
using the host to check the available resources of the memory card device;
comparing the available resources of the host with the available resources of the memory card device; and
determining which FTL functions will be executed in the host and which FTL functions will be executed in the memory card device in response to the comparison.

38. A method as defined in claim 26, wherein the available resources of the host comprise at least one of processor type, processor speed, memory size, memory speed, bus type, bus speed, encryption type or encryption speed.

39. A method as defined in claim 25 wherein the FTL functions comprise at least one of address mapping, wear leveling, garbage collection or erase count accumulation.

40. A method as defined in claim 25 wherein a communication protocol between the host and the device comprises at least one of a universal serial bus protocol or an advanced technology attachment protocol.

41. A method as defined in claim 25, further comprising loading at least one vendor specific memory card device driver into a random access memory of the host.

42. A method as defined in claim 25, further comprising loading meta data from the memory card device to the host.

43. A method as defined in claim 42 wherein the meta data comprises at least one of erase count data, garbage collection data or mapping table data loaded to the host random access memory from the memory card device.

44. A method as defined in claim 25, further comprising initializing in the host the FTL functions to be executed by the host.

45. A method as defined in claim 25, further comprising activating in the host the FTL functions to be executed by the host.

46. A method as defined in claim 25, further comprising:
producing a write request from the host;
reading mapping information using host memory management functions;
checking for write space available on the memory card device; and
sending the write request to the device if there is write space available on the device.

47. A method as defined in claim 25, further comprising:
checking for garbage blocks on the memory card device;
if there are no garbage blocks on the device, performing garbage collection, designating garbage blocks and updating garbage collection data; and
erasing the garbage blocks.

48. A method as defined in claim 25, further comprising:
checking the need for wear leveling on the memory card device; and
if wear leveling is needed, performing wear leveling and updating meta data for wear leveling.

49. A method as defined in claim 25, further comprising:
executing by the host the FTL instructions loaded to the random access memory of the host; and
executing by the memory card device those FTL instructions not loaded to the random access memory of the host.

50. A flash memory card system, comprising:
a flash memory card device comprising a controller and a flash memory in signal communication with the controller, the flash memory comprising a region having an operating system image and a region having user data; and
a host in signal communication with the flash memory card device,
wherein flash translation layer (FTL) functions executable by both the memory card device and the host are partitioned such that overlapping functions activated on one of the host or the flash memory card device are not activated on the other of the host or flash memory card device, respectively, and
wherein FTL functions for execution by the flash memory card device are provided by operating system image executable by the flash memory card device and FTL functions for execution by the host are provided by device drivers executable by the host.

51. The flash memory card system of claim 50, wherein the device drivers are vendor specific device drivers having FTL software modules loadable to the host.

* * * * *